United States Patent
Cornelissen et al.

(10) Patent No.: US 9,494,875 B2
(45) Date of Patent: Nov. 15, 2016

(54) CHUCK, A CHUCK CONTROL SYSTEM, A LITHOGRAPHY APPARATUS AND A METHOD OF USING A CHUCK

(71) Applicant: ASML Netherlands B.V., Veldhoven (NL)

(72) Inventors: Sebastiaan Maria Johannes Cornelissen, Eindhoven (NL); Noud Jan Gilissen, 's-Gravenzande (NL); Anko Jozef Cornelus Sijben, Veghel (NL); Roger Wilhelmus Antonius Henricus Schmitz, Helmond (NL); Arnoud Willem Notenboom, Rosmalen (NL); Ronald Van Der Wilk, Knegsel (NL); Manon Elise Will, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 272 days.

(21) Appl. No.: 14/349,900

(22) PCT Filed: Sep. 19, 2012

(86) PCT No.: PCT/EP2012/068386
§ 371 (c)(1),
(2) Date: Apr. 4, 2014

(87) PCT Pub. No.: WO2013/050243
PCT Pub. Date: Apr. 11, 2013

(65) Prior Publication Data
US 2014/0253900 A1 Sep. 11, 2014

Related U.S. Application Data

(60) Provisional application No. 61/544,039, filed on Oct. 6, 2011.

(51) Int. Cl.
*G03F 7/20* (2006.01)
*H01L 21/683* (2006.01)
(Continued)

(52) U.S. Cl.
CPC ........... *G03F 7/70708* (2013.01); *G03F 7/707* (2013.01); *G03F 7/70875* (2013.01);
(Continued)

(58) Field of Classification Search
CPC ........... G03F 7/70708; G03F 7/70875; G03F 7/707; G03F 7/708; G03F 7/70908; G03F 7/70941; H01L 21/6831
See application file for complete search history.

(56) References Cited

U.S. PATENT DOCUMENTS

| | | | |
|---|---|---|---|
| 5,835,334 A | 11/1998 | McMillin et al. | |
| 6,084,938 A | 7/2000 | Hara et al. | |

(Continued)

FOREIGN PATENT DOCUMENTS

| | | |
|---|---|---|
| EP | 0 320 297 A2 | 6/1989 |
| EP | 0 360 529 A2 | 3/1990 |

(Continued)

OTHER PUBLICATIONS

Frickensmith, J.J., "Metal Shop: Electrolysis and Grounding 101," accessed at http://www.erareplicas.com/427man/cooling/electrolysis/index.htm on Jul. 17, 2014; 4 pages.

(Continued)

*Primary Examiner* — Michelle M Iacoletti
(74) *Attorney, Agent, or Firm* — Sterne, Kessler, Goldstein & Fox P.L.L.C.

(57) ABSTRACT

A chuck, chuck control system, lithographic apparatus and method of using a chuck are disclosed. In an embodiment, there is provided a chuck (43) for use in holding a patterning device (MA) or a substrate (W) onto a supporting table (MT, WT) of a lithography apparatus (100) by electrostatic force, in which the patterning device is for imparting a radiation beam (B) with a pattern in its cross-section to form a patterned radiation beam, and the substrate is for receiving the patterned radiation beam; said chuck comprising: a dielectric member (45); a temperature conditioning fluid channel (48) formed within the chuck; a drive electrode (40, 42) for applying a potential difference between the drive electrode and the patterning device or substrate across the dielectric member in order to electrostatically attract the patterning device or substrate towards the drive electrode; and a first shield electrode (60) for reducing or preventing the development of an electric field across temperature conditioning fluid in the temperature conditioning fluid channel due to a voltage applied to the drive electrode, in order to reduce or prevent electrolysis in the fluid.

20 Claims, 5 Drawing Sheets

(51) Int. Cl.
*G10L 15/08* (2006.01)
*G10L 15/22* (2006.01)

(52) U.S. Cl.
CPC ........... *G03F 7/70908* (2013.01); *G10L 15/08* (2013.01); *H01L 21/6831* (2013.01); *G10L 2015/223* (2013.01)

(56) References Cited

U.S. PATENT DOCUMENTS

| | | | |
|---|---|---|---|
| 6,215,643 | B1 | 4/2001 | Nagasaki |
| 2004/0079518 | A1* | 4/2004 | del Puerto .......... G03F 7/70716 165/58 |
| 2004/0218339 | A1 | 11/2004 | Nakamura |
| 2005/0134828 | A1* | 6/2005 | Ottens ..................... G03F 7/707 355/75 |
| 2005/0211694 | A1 | 9/2005 | Moroz |
| 2007/0195482 | A1 | 8/2007 | Muka et al. |
| 2008/0017104 | A1* | 1/2008 | Matyushkin ...... H01L 21/67109 118/696 |
| 2009/0159590 | A1 | 6/2009 | Yonekura et al. |
| 2009/0207392 | A1 | 8/2009 | Rijpma et al. |
| 2010/0096262 | A1 | 4/2010 | Aruga et al. |
| 2011/0083837 | A1 | 4/2011 | Sasaki et al. |
| 2011/0164343 | A1 | 7/2011 | Sogard |

FOREIGN PATENT DOCUMENTS

| | | |
|---|---|---|
| EP | 0 439 000 A1 | 7/1991 |
| EP | 1 359 466 A1 | 11/2003 |
| JP | 08-172123 A | 7/1996 |
| JP | H9172053 A | 6/1997 |
| JP | 2000-277595 A | 10/2000 |
| JP | 2002004051 A | 1/2002 |
| JP | 2003243371 A | 8/2003 |
| JP | 2004095665 A | 3/2004 |
| JP | 2004158751 A | 6/2004 |
| JP | 2008028354 A | 2/2008 |
| JP | 2011086712 A | 4/2011 |
| WO | WO 92/20093 A1 | 11/1992 |
| WO | WO 2011/083751 A1 | 7/2011 |

OTHER PUBLICATIONS

International Search Report directed to related International Patent Application No. PCT/EP2012/068386, mailed Feb. 25, 2013; 8 pages.

International Preliminary Report on Patentabilty and Written Opinion of the International Searching Authority directed to related International Patent Application No. PCT/EP2012/068386, issued Apr. 8, 2014; 11 pages.

* cited by examiner

CHUCK, A CHUCK CONTROL SYSTEM, A LITHOGRAPHY APPARATUS AND A METHOD OF USING A CHUCK

CROSS-REFERENCE TO RELATED APPLICATIONS

This application claims the benefit of U.S. provisional application 61/544,039, which was filed on 6 Oct. 2011, and which is incorporated herein in its entirety by reference.

FIELD

The present invention relates to a chuck, a chuck control system, a lithographic apparatus and a method of using a chuck.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

A chuck may be provided for holding a patterning device for imparting a radiation beam with a pattern in its cross section or a substrate for receiving the patterned radiation beam. The chuck may be configured to hold the patterning device or substrate by electrostatic attraction. The chuck may provide Johnsen-Rahbek (JR) clamping, Coulomb clamping, or both, for example. The temperature of the chuck may be controlled by driving a temperature conditioning fluid through channels formed within the chuck. It has been found in such arrangements that the interior walls of the channels, and/or of apparatus external to the chuck that is in contact with the fluid, can degrade over time.

It has also been found that electric current formed within the chuck during operation can lead to resistive heating of the chuck. Such heating can be compensated by the fluid in the channels. However, it can be difficult to compensate for sudden changes in the dissipated power, for example when the chuck is turned off to unmount a patterning device or substrate.

US 2009/207392 A discloses a lithographic apparatus configured to transfer a pattern from a patterning structure, held by a patterning structure holder, onto a substrate that is held by a substrate holder. The apparatus includes a first object holder configured to hold an object, and an object temperature conditioner configured to condition a temperature of the object prior to and/or during transfer of the objection to the first object holder. The object temperature conditioner includes a second object holder having a fluid duct system and an electrical temperature conditioner.

WO 92/20093 A discloses an electrostatic chuck assembly including a top multilayer ceramic insulating layer, and electrostatic pattern layer having a conductive electrostatic pattern disposed on a multilayer ceramic substrate, a multilayer ceramic support layer, and, a heat sink base having back side cooling channels machined therein. The heat sink base is brazed to the bottom of the multilayer ceramic support layer.

SUMMARY OF THE INVENTION

It is desirable to at least partially address one or more of the abovementioned problems. For example, it is desirable to provide an arrangement in which the channels and/or external apparatus that is in contact with the fluid do not degrade over time. For example, it is desirable to avoid changes in temperature of the chuck during unmounting and mounting of the patterning device or substrate.

The slope of the invention is defined in the appended claims.

BRIEF DESCRIPTION OF THE DRAWINGS

Embodiments of the invention will now be described, by way of example only, with reference to the accompanying schematic drawings in which corresponding reference symbols indicate corresponding parts, and in which.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number

DETAILED DESCRIPTION

Figure 1:
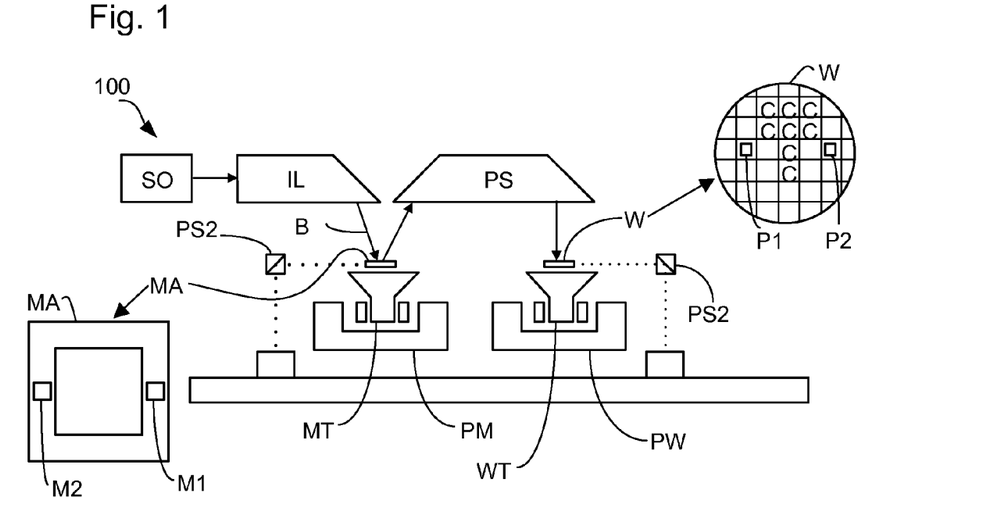
FIG. 1 depicts a lithographic apparatus according to an embodiment of the invention.

FIG. 1 schematically depicts a lithographic apparatus 100 including a source collector module SO according to one embodiment of the invention. The apparatus comprises:
- an illumination system (illuminator) IL configured to condition a radiation beam B (e.g., EUV radiation).
- a support structure (e.g., a mask table) MT constructed to support a patterning device (e.g., a mask or a reticle) MA and connected to a first positioner PM configured to accurately position the patterning device;
- a substrate table (e.g., a wafer table) WT constructed to hold a substrate (e.g., a resist-coated wafer) W and connected to a second positioner PW configured to accurately position the substrate; and
- a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation. In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
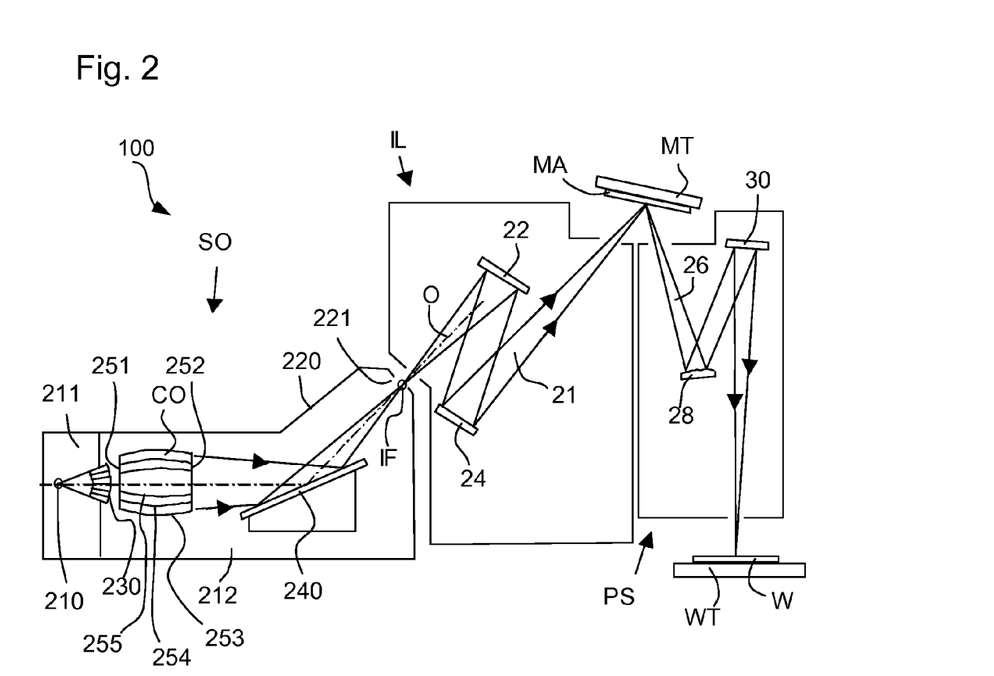
FIG. 2 is a more detailed view of the apparatus 100.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) that is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO, which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
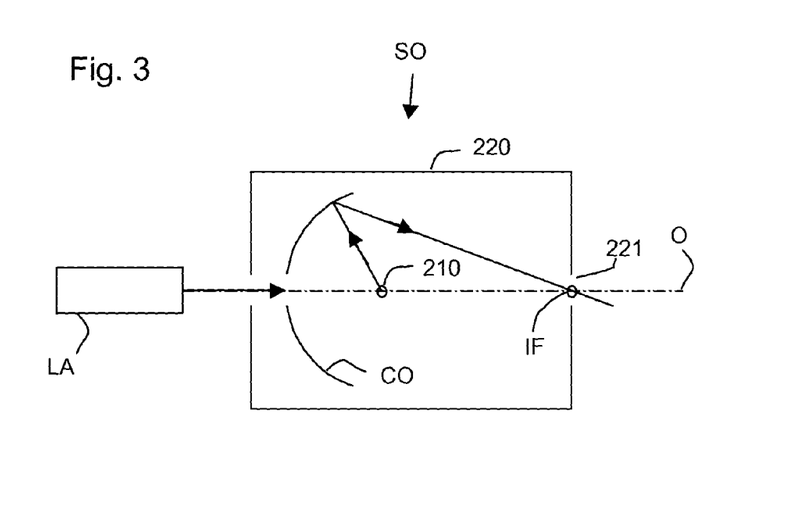
FIG. 3 is a more detailed view of the source collector module SO of the apparatus of FIGS. 1 and 2.

Alternatively, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4:
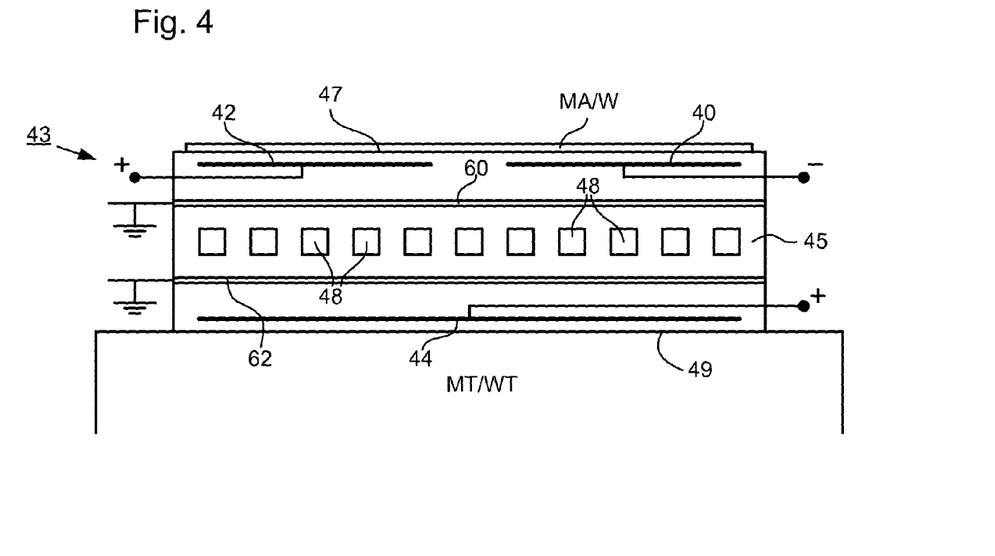
FIG. 4 depicts an electrostatic chuck comprising two drive electrodes, a chuck clamping electrode, temperature conditioning fluid channels, and two planar shield electrodes.

In an embodiment, a chuck is provided for holding by electrostatic force onto a supporting table of a lithography apparatus: a patterning device MA; or a substrate W. Such a chuck may be referred to as an electrostatic chuck. FIG. 4 illustrates an example of such a chuck 43. In the embodiment shown, the chuck 43 is mounted on a supporting table MT/WT. Where the chuck 43 is configured to support a patterning device MA, the supporting table may be referred to as a mask table MT. Where the chuck 43 is configured to hold a substrate W, the supporting table may be referred to as a substrate table WT.

During use the patterning device MA or substrate W may be heated by the radiation beam of the lithography apparatus. Such heating (and/or other thermal loads) can be compensated by driving fluid through temperature conditioning fluid channels 48 formed within the chuck 43. The channels may be connected together to form a network for example. Various channel configurations are possible to achieve the desired effect of bringing temperature conditioning fluid into contact with the material of the chuck in order to exchange heat with the chuck and thereby control the temperature of the chuck. The flow rate and/or temperature of the fluid may be controlled to achieve the desired heat exchange properties and to control the temperature of the chuck.

In an embodiment, the chuck 43 comprises a dielectric member 45. The channels 48 in such an embodiment may be formed within the dielectric member 45.

In an embodiment, the chuck 43 further comprises a drive electrode 40, 42 for applying a potential difference between the drive electrode and a first surface 47 of the dielectric member 45. The potential difference may be such as to cause a charge to accumulate on the first surface 47. The accumulated charge can electrostatically attract and hold a patterning device MA or a substrate W that is brought into contact with the first surface 47. This effect is known as the Johnsen-Rahbek effect. Chucks/clamps that operate based on this effect may be referred to as Johnsen-Rahbek chucks/clamps, J-R chucks.clamps, or JR chucks/clamps. In an embodiment, the dielectric member 45 comprises aluminium nitride.

In an embodiment, the dielectric 43 may have a resistivity that is so high that no significant current can pass between the drive electrode 40, 42 and the first surface 27. In this case, the Johnsen-Rahbek effect may not occur to a significant extent. However, an attractive force between the drive electrode 40, 42 and the patterning device MA or substrate W may still occur due to the potential difference between these elements. The drive electrode 40, 42 and the patterning device MA or substrate W may act as two plates of a capacitor and be attracted to each other in the same way as the two plates of a charged capacitor. Chucks/clamps that operate predominantly on this principle may be referred to as Coulomb clamps.

JR clamps will also involve some degree of attraction by the Coulomb mechanism, but the JR effect will normally be dominant in such clamps.

JR clamps and Coulomb clamps are well known in the field.

In an embodiment, the chuck may be configured so that the patterning device MA or substrate W lies flush against a flat surface of chuck 43. Such an arrangement will tend to favour strong adhesion of the patterning device MA or substrate W to the chuck 43. In an alternative embodiment, the chuck 43 may be configured so that the patterning device MA or substrate W lies against a plurality of protruding burls. In such an embodiment, the region between the supporting table MT/WT and the patterning device MA or substrate W may be maintained at partial vacuum. Such an arrangement will tend to facilitate removal of the patterning device MA or substrate W, for example because Van der Waals forces acting between the supporting table MT/WT and the patterning device MA or substrate W are less strong.

In the embodiment shown, two drive electrodes 40 and 42 are provided. This arrangement may be referred to as a bipolar arrangement. In alternative embodiments, a single drive electrode (monopolar) or more than two drive electrodes (multipolar) may be provided. Multipolar Coulomb and JR clamps are known in the field.

As mentioned above, in electrostatic chucks comprising temperature conditioning fluid channels, the channels and/or elements of external apparatus that come into contact with the fluid can degrade over time. It has been recognized that at least a component of this degradation may be due to electrolysis effects within the temperature conditioning fluid. The electrolysis may occur due to differences in the electric potential on the inside surface of the channels at different positions. Alternatively or additionally, the electrolysis may occur due to a difference in potential between all or a portion of the inside surfaces of the channels within the chuck and one or more elements of external apparatus that come into contact with the fluid. Elements that are at different electric potentials and in contact with a given body of fluid may act as electrolysis electrodes. The electric field caused by the electrodes may lead to an electric current flowing between the electrodes through the fluid. The electric current can cause electrically stimulated degradation of the material in contact with the fluid and/or of the fluid itself. Thus, the difference in electric potential stimulates an electro-chemical reaction which degrades machine parts in contact with the fluid.

The drive electrodes in electrostatic chucks could cause the potential differences and/or currents mentioned above and thereby cause electrolysis and the associated component degradation.

In an embodiment, a shield electrode is provided for reducing or preventing electrolysis effects. Preferably the shield electrode is connected to ground or earth.

In the embodiment shown in FIG. 4, a shield electrode 60 is provided between the drive electrodes 40, 42 and the channels 48. In the embodiment shown, the shield electrode 60 is planar in form. In an embodiment, the shield electrode 60 is formed from a sheet of metal. In an embodiment, the shield electrode 60 spans the chuck 43 so as to substantially separate a region of the dielectric member 45 containing the drive electrodes 40, 42 from a region of the dielectric member 45 containing the temperature conditioning fluid channels 48. In this way, the shield electrode 60 can reduce or prevent a voltage applied to the drive electrodes 40, 42 causing a change in the potential at the walls of the channels 48. Electrolysis due to the drive electrodes 40, 42 can thereby be reduced or prevented.

In an embodiment, the chuck 43 may also be clamped to the supporting table MT/WT using an electrostatic force. This clamping may be implemented using the Coulomb effect, the JR effect, or both. In the embodiment depicted in FIG. 4, this is achieved by means of a chuck clamping electrode 44 formed adjacent to a second surface 49 of the dielectric member 45. In the example shown, a single chuck clamping electrode 44 is provided. However, in alternative embodiments, a plurality of chuck clamping electrodes 44 could be provided. In order to prevent a voltage applied to the chuck clamping electrode 44 from leading to electrolysis within the temperature conditioning fluid, a shield electrode 62 is provided between the chuck clamping electrode 44 and the channels 48. The shield electrode 62 may be formed in the same way as the shield electrode 60, for example. The shield electrode 62 may be configured to substantially separate a region of the dielectric member 45 containing the chuck clamping electrode 44 from a region of the dielectric member 45 containing the channels 48, for example.

In the embodiment illustrated in FIG. 4, during clamping of a patterning device MA or substrate W the drive electrode 40 is maintained at a negative potential and the drive electrode 42 is maintained at a positive potential. In an embodiment, the sizes of the potentials supplied to the drive electrodes 40 and 42 are equal. In alternative embodiments, the potentials may be different. In the example shown, the clamping electrode 44 is maintained at a positive potential, but this is not essential. In alternative embodiments, the chuck clamping electrode may be maintained at a negative potential.

Figure 5:
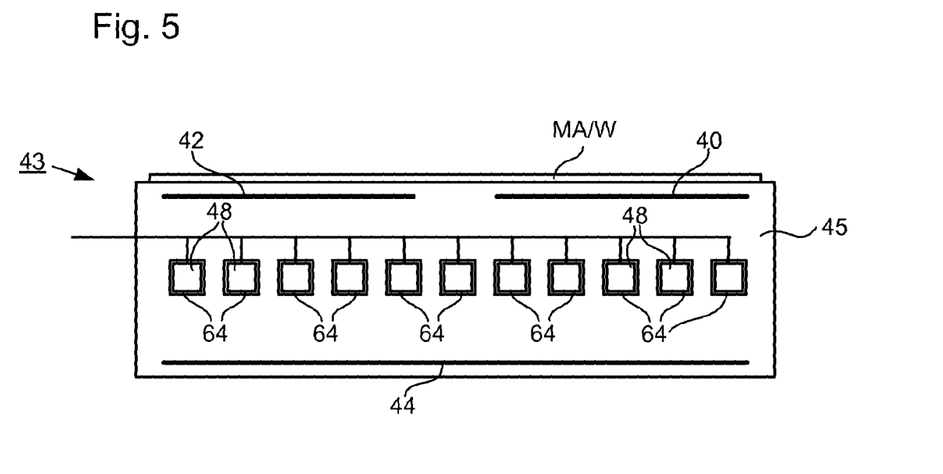
FIG. 5 depicts an electrostatic chuck comprising shield electrodes surrounding temperature conditioning fluid channels.

FIG. 5 depicts a chuck 43 according to an alternative embodiment. The chuck 43 of FIG. 5 is the same as the chuck 43 of FIG. 4 except for the configuration of the shield electrodes. In FIG. 4, two planar shield electrodes 60, 62 are provided. In the embodiment of FIG. 5, shield electrodes 64 are instead configured to surround the channels 48. For example, the shield electrodes 64 may be formed as a coating on the inner surfaces of the holes in the dielectric member 45 that define the channels 48. Preferably the shield electrodes 64 are in contact with the fluid in the channels 48 in use or in close proximity to the fluid in the channels 48 in use. The shield electrodes 64 of FIG. 5 are thus effective for separating the temperature conditioning fluid within the channels from all or a majority of the dielectric member 45 outside of the channels. Therefore, any voltages applied to the drive electrodes 40, 42 or to the chuck clamping electrode 44 cannot cause any significant differences in potential at different positions within the temperature conditioning fluid channels 48. Indeed, in an embodiment the shield electrodes are arranged to be highly conductive, for example metallic, and by virtue of this conductivity will define equipotential or near-equipotential surfaces.

If the shield electrodes 64 are not grounded, there remains the possibility of a difference in potential between the shield electrodes 64 and elements of the apparatus external to the chuck 43 that provides the fluid to the channels 48. This difference in potential could cause electrolysis (electrochemical reactions) and degradation of the shield electrodes 64, inner surfaces of the channels 48 and/or of components of any external apparatus that are in contact with the fluid in use. It is therefore preferable to connect the shield electrodes 64 to ground, as shown in the example depicted in FIG. 5.

Figure 6:
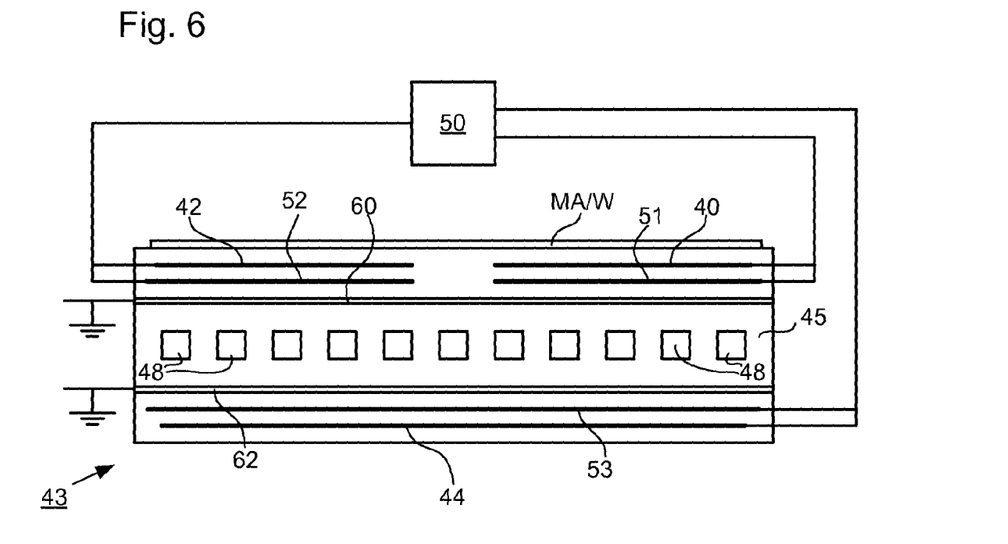
FIG. 6 depicts an electrostatic chuck further comprising two compensating electrodes and an electrode driving system.

The shield electrodes are provided primarily to prevent electrolysis effects in the temperature conditioning fluid. However, the shield electrodes may also be configured to reduce or prevent undesirable electrical discharges between the dielectric member 45 and other elements of the lithography apparatus. For example, the shield electrodes may be configured to reduce the voltage on peripheral edges of the chuck 43. This may be achieved by extending the shield members so that they reach the peripheral edges of the dielectric member 45 (as shown in the embodiments of FIGS. 4 and 6, for example). The shield electrodes could also be effective for reducing or preventing discharge between the dielectric member 45 and elements protruding through holes, such as holes for mounting pins, that may pass through the dielectric member 45.

When any of the electrodes in the chuck are maintained at an elevated voltage in order to provide electrostatic clamping, resistive heating will occur in the dielectric member 45. When the chuck 43 is driven in a constant manner (i.e., with stable, constant voltages applied to the drive electrodes and chuck clamping electrode) the dissipated power will also be constant. During such periods it is possible to compensate for the heating relatively accurately using the temperature conditioning fluid channels 48. However, where the dissipated power changes suddenly it may be more difficult to compensate accurately using the temperature conditioning fluid channels 48. Rapid changes in the dissipated power will occur, for example, when the drive electrodes 40, 42 are switched off in order to unload and/or load a patterning device MA or substrate W and/or when the drive electrodes 40, 42 are switched back on again. Similarly, it may occasionally be necessary to switch off the chuck clamping electrode 44 and this would also result in a sudden change in the dissipated power in the dielectric member 45.

FIG. 6 depicts an embodiment of a chuck 43 that comprises compensating electrodes 51, 52 and 53 for providing electric currents in the dielectric member 45 that compensate for the absence of heat dissipation when the drive electrodes 40, 42 and the chuck clamping electrode 44, respectively, are switched off. The compensating electrodes 51, 52 and 53 are configured to provide a heating within the dielectric member 45 that is equivalent to the heating that would have been provided by driving the drive electrodes 40, 42 and the chuck clamping electrode 44.

The compensating electrode 51 may be positioned in between the drive electrode 40 and the shield electrode 60. In an embodiment, the compensating electrode 51 is positioned and shaped such that when the voltage applied to the drive electrode 40 is zero, a voltage can be applied to the compensating electrode 51 that causes a dissipated power in the region between the drive electrode 40 and the shield electrode 60 that is substantially the same as the dissipated power when the drive electrode 40 is switched on. One way in which this can be achieved is by positioning the compensating electrode 51 to be equidistant from the drive electrode 40 and the shield electrode 60 and applying a voltage to the compensating electrode 51 that is half the size of the voltage applied to the drive electrode 40 when it is switched on. For example, if the drive electrode 40 is configured to operate at a voltage Vs when clamping the patterning device MA or substrate W to the chuck 43, the voltage applied to the compensating electrode 51 when the driving electrode 40 is switched off may be Vs/2. In this way, the spatial average magnitude of the electric field in the region between the drive electrode 40 and the shield electrode 60 during clamping of a patterning device MA or substrate W may be the same as the spatial average magnitude of the electric field during a period when the drive electrode 40 is switched off, for example during unmounting or mounting of the patterning device MA or substrate W. For example, if the drive electrode 40 is maintained at a voltage of 1 kV when switched on, the potential difference between the drive electrode 40 and the compensating electrode 51 (which may be allowed to float during this period) will be 500V because it is positioned halfway between the drive electrode 40 and the grounded shield electrode 60. The potential difference between the floating compensating electrode 51 and the shield electrode 60 will also be 500V. The voltage thus follows the sequence 1 kV-500V-0V, from the drive electrode 40 to the floating compensating electrode 51 to the shield electrode 60. When the drive electrode 40 is switched to 0V (i.e., switched off) or connected to ground the compensating electrode 51 is maintained at 1 kV/2, i.e., 500V. Thus, the voltage sequence becomes 0V-500V-0V. The magnitude of the electric field is thus the same. The dissipated power thus remains constant in the region between the drive electrode 40 and the shield electrode 60. Keeping the dissipated power constant facilitates accurate temperature control of the chuck.

In other embodiments, the compensating electrode may be positioned so as not to be equidistant from the drive electrode 40 and the shield electrode 60. In other embodiments, the compensating electrode may be maintained at a voltage other than Vs/2 when the driving electrode 40 is switched off.

The above discussion concerning operation of the compensating electrode 51 between the drive electrode 40 and the shield electrode 60 applies, with the necessary changes as would become apparent to a person having ordinary skill in the art, to the compensating electrode 52 between the drive electrode 42 and the shield electrode 60 and to the compensating electrode 53 between the chuck clamping electrode 44 and the shield electrode 62.

In the example depicted in FIG. 6, compensating electrodes are provided between both of the drive electrodes 40, 42 and the shield electrode 60 and between the chuck clamping electrode 44 and the shield electrode 62. However, in other embodiments fewer compensating electrodes may be provided. For example, the compensating electrode 53 may be omitted. In some embodiments the compensating electrode 53 may be of less value than the compensating electrodes 51 and 52 because the chuck 43 may be disconnected from the supporting table WT/MT relatively infrequently in comparison with changes of the patterning device MA or substrate W.

FIG. 6 also depicts an electrode driving system 50 for driving the electrodes within the chuck 43. The electrode driving system 50 may be configured to control the voltages applied to one or more of the electrodes and/or to selectively connect one or more of the electrodes to ground as necessary. For example, the electrode driving system 50 may be configured to apply a voltage of +/− Vs to the drive electrodes 40, 42, while allowing the compensating electrodes 51 and 52 to float during clamping of the patterning device MA or substrate W. The electrode driving system 50 may then be configured to switch the voltages applied to the drive electrodes 40 and 42 to zero and apply a voltage of +/− Vs/2 to the compensating electrodes 51 and 52 to allow unmounting/mounting of the patterning device MA or substrate W. Similarly, the electrode driving system 50 may be configured to apply a voltage Vt to the chuck clamping electrode 44, while allowing the compensating electrode 53 to float, during clamping of the chuck 43 to the supporting table MT/WT. The electrode driving system 50 may be configured to apply a zero voltage to the chuck clamping electrode 44 and a voltage of Vt/2 to the compensating electrode 53 when the chuck 43 is to be disconnected from the supporting table MT/WT.

Figure 7:
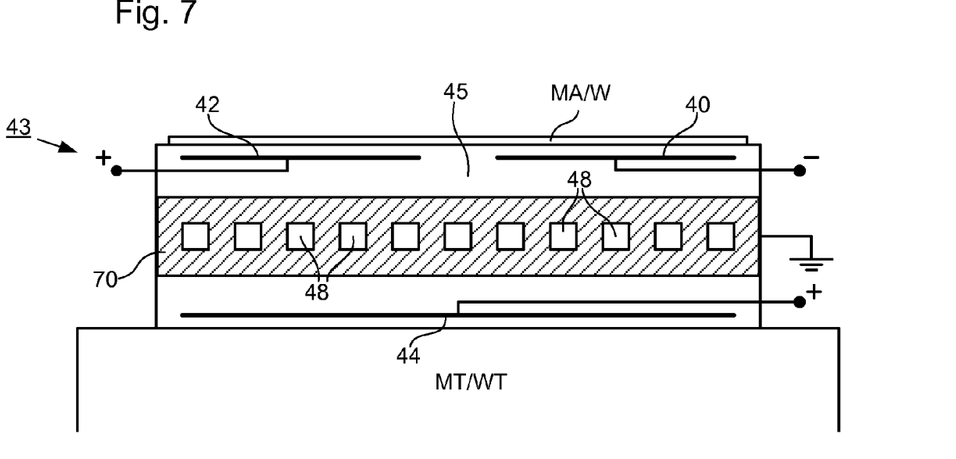
FIG. 7 depicts an electrostatic chuck further comprising an insulating element surrounding the temperature conditioning fluid channels.
Figure 8:
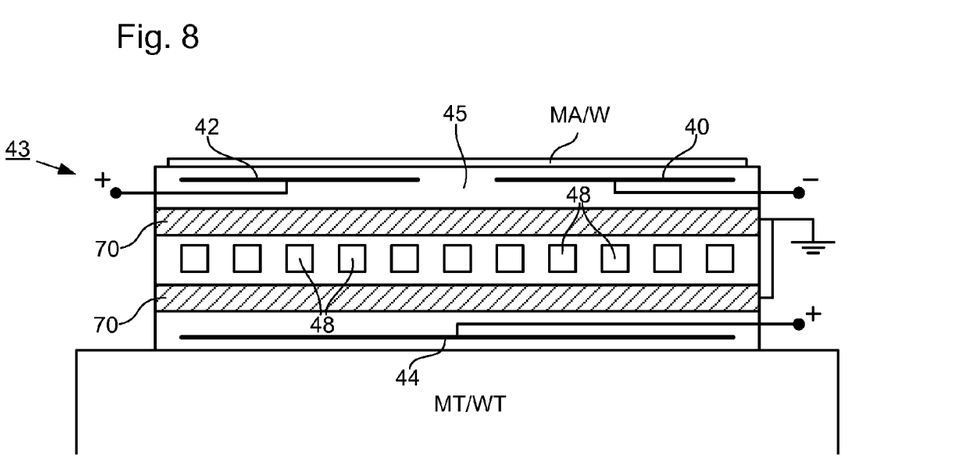
FIG. 8 depicts an electrostatic chuck further comprising an insulating element in the form of layers between the drive electrode and the channels and between the chuck clamping electrode and the channels.

In the embodiments discussed above, the dielectric member 45 may form a single integral block of material with the channels 48 being formed directly within the block. This approach may be efficient for manufacturing purposes. However, in alternative embodiments, the chuck body may be formed from a plurality of different materials. The different materials may be bonded together in layers for example. FIGS. 7 and 8 below provide examples of such arrangements.

In an embodiment, the temperature conditioning fluid channel is separated from the drive electrode or chuck clamping electrode by an electrically insulating element 70 that has a higher resistivity than the resistivity of the dielectric member 45 between the drive electrode 40, 42 and the patterning device MA or substrate W and/or than the dielectric member 45 between the chuck clamping electrode 44 and the supporting table MT/WT. For example, the resistivity of the electrically insulating element 70 may be higher than the resistivity that would be required for the dielectric member of a JR clamp.

In FIG. 7 the insulating element 70 comprises a region of material within which one or more of the channels 48 are embedded.

FIG. 8 shows an embodiment in which the insulating element 70 comprises a layer separating the drive electrode 40, 42 from the channels 48 and a layer separating the chuck clamping electrode 44 from the channels 48. In the arrangement shown, two layers are provided. However, this is not essential. In other embodiments, either or both of the layers may be omitted.

In an embodiment, the insulating element 70 is connected to ground (earth).

The insulating element 70 reduces or prevents electrical currents from flowing in the region of the channel and therefore reduces or avoids electrolysis effects and reduces resistive heating.

In the examples discussed above the chuck 43 is clamped to the supporting table MT/WT electrostatically. However this is not essential. The chuck 43 could be clamped to the supporting table MT/WT in other ways. For example the chuck 43 could be clamped to the supporting table MT/WT using glue or optical contacting or brazing or bonding. In an embodiment, the chuck 43 is formed integrally with the supporting table MT/WT, i.e., the chuck 43 is part of the supporting table MT/WT.

The chuck 43 may be clamped to the supporting table MT/WT by the same mechanism (e.g., Coulomb or JR) that is used to clamp the patterning device MA or substrate W to the supporting table MT/WT. However this is not essential. The chuck 43 could be clamped to the supporting table MT/WT using a different mechanism to that used to clamp the patterning device MA or substrate W to the supporting table MT/WT. For example, the chuck 43 could be clamped to the supporting table MT/WT using a Coulomb clamp while the patterning device MA or substrate W is clamped to the chuck 43 using a JR clamp, or vice versa.

The time constant of local thermal loads on the chuck during imaging of a die is typically of the order of 0.1 seconds. The temperature conditioning provided by the fluid channel typically has a much longer time constant, for example of the order of 10 seconds. Because of this longer time constant, local load effects cannot be completely compensated by the cooling provided by the temperature conditioning fluid. It is possible to use computer modeling to obtain correction factors based on prediction of thermo-mechanical effects. However, the correction cannot be perfect and device performance, for example overlay, remains negatively affected.

During clamping of a wafer, heat dissipation in the chuck will cause heat to be transferred to the fluid in the channels. This will tend to cause a temperature gradient along the fluid in the channels and along the region of the chuck defining the channels that is adjacent to the fluid. During phases where the wafer is unclamped an extra heater may be used to provide an equivalent heating so that the contribution to temperature gradients from heating of the chuck remains constant. Friction between the fluid and the walls of the channel may also cause heating of the fluid and walls. Such friction causes a pressure drop along the channel. The size of the pressure drop can provide a measure of the amount of heating due to this mechanism. This frictional heating also contributes to the temperature gradient along the fluid in the channels and along the region of the chuck defining the channels.

Keeping temperature gradients in the chuck constant facilitates software-based correction of thermo-mechanical effects but is not sufficient to enable perfect correction.

The size of the overlay errors will tend to increase as the total amount of heating caused by the clamping increases. Thus, to achieve a given overlay accuracy it will be necessary to limit the total heating to a particular maximum value. This limitation restricts the choice of material that can be used for the body material of the chuck, which is undesirable. This limitation also restricts the choice of various operational characteristics relevant for compensating for the heating, such as the required geometry of the temperature conditioning fluid channel, the flow rate of the fluid, the heat capacity of the fluid, the density of the fluid, the thermal conductivity of the fluid, and the kinematic viscosity of the fluid.

The inventors have recognized that decreasing the size of temperature gradients within the chuck can facilitate more accurate correction of thermo-mechanical effects. Improving the accuracy of the correction reduces the restrictions on the maximum allowable level of heating, and on other operational characteristics relevant to compensating for the heating, for a given level of overlay accuracy.

In an embodiment, the temperature gradients within the chuck are reduced by providing a channel heater that is configured to apply a localized heating in the region of the chuck that defines the temperature conditioning fluid channel 48. The localized heating is configured to vary as a function of position along the length of the channel 48. In an embodiment, the variation in localized heating is achieved by providing the channel heater only along a selected portion of the length of the channel 48. Portions of the length of the channel where the channel heater is not provided will be heated less by the channel heater than portions of the length of the channel where the heater is present. Alternatively or additionally, the variation in the localized heating is achieved by arranging for the channel heater to provide a variable output power per unit length of the channel heater.

Figure 9:
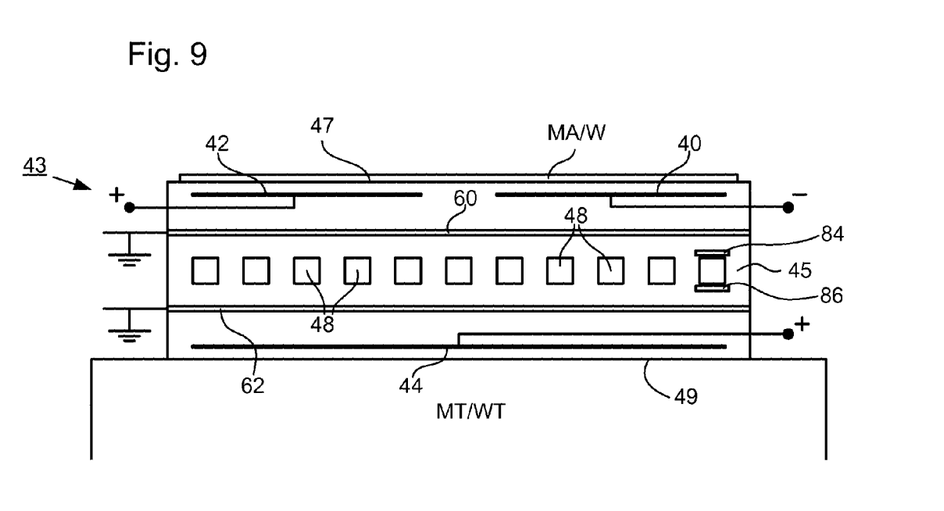
FIG. 9 depicts an electrostatic chuck of the type illustrated in FIG. 4, further comprising a channel heater.
Figure 10:
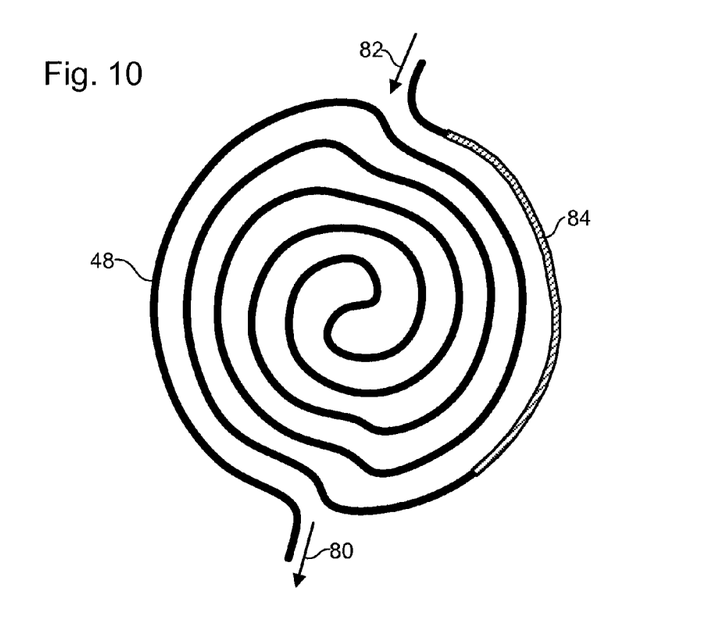
FIG. 10 is a schematic top view of the embodiment of FIG. 9 showing the geometry of the temperature conditioning fluid channel and the associated channel heater.

An example configuration is illustrated in FIGS. 9 and 10. FIG. 9 is a schematic side view showing a chuck corresponding to arrangement of FIG. 4 except that channel heaters 84 and 86 have been added. Channel heaters could also be provided to any of the other embodiments discussed above. FIG. 10 is a schematic top view showing the geometry of the channel 48. Arrow 82 indicates entry of fluid. After entry, the fluid circulates first in a clockwise direction and then in an anticlockwise direction before exiting (arrow 80). The region of the chuck that defines the channel is the region of the chuck directly adjacent to the channel and which defines the cavity through which the fluid flows. In an embodiment, the channel heater is provided along all or a majority of the length of the channel 48 within the chuck. In an embodiment of this type, the heater is configured to provide an output power that varies as a function of position along the heater in order to provide the variation in the localized heating. FIGS. 9 and 10 illustrate an embodiment of the alternative type in which a channel heater 84,86 is provided only along a selected portion of the length of the channel 48. A higher level of heating is provided at regions along the length of the channel 48 where the channel heater 84,86 is present and a lower level of localized heating or substantially no localized heating is provided at other regions along the length of the channel 48.

In an embodiment, the channel heater 84, 86 is configured to provide the localized heating that varies along the length of the channel in such a way that temperature gradients within the chuck are reduced during use. In an embodiment, this reduction in temperature gradients is achieved by providing a higher level of heating to a region of the chuck defining a first length of the channel (e.g. the length of channel shown in FIG. 10 where the channel heater 84 is present) than to a region of the chuck defining a second length of the channel 48 (e.g. in the arrangement of FIG. 10 the length of channel between the downstream end of the channel heater 84 and the exit point at arrow 80). In an embodiment of this type, the first length of channel is upstream from the second length of channel. This type of arrangement tends to be effective for reducing temperature gradients because the fluid will tend to heat up as it circulates through the chuck. Fluid in upstream regions of the channel 48 (and in portions of the chuck adjacent to the upstream regions) will therefore tend to be cooler than fluid in downstream regions of the channel 48 (and in portions of the chuck adjacent to the downstream regions). By configuring the channel heater 84,86 to compensate this effect it is possible to reduce temperature gradients in the chuck. Reducing temperature gradients facilitates correction of thermo-mechanical effects due to heat loads on the chuck. Device performance, particularly overlay, can therefore be improved.

In the embodiment shown in FIGS. 9 and 10, the channel heater 84,86 is provided both on the side of the channel 48 that is nearest to the patterning device or substrate MA/W and on the side of the channel 48 opposite to the patterning device or substrate MA/W. However, this is not essential. In other embodiments, the channel heater may be provided on one of the two sides only. Alternatively, the substrate heater may be configured to surround the channels in a loop or helix, or in any other geometrical configuration that provides the required localized heating that varies along the length of the channel.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

The invention claimed is:

1. A chuck configured to hold an object onto a supporting table of a lithography apparatus by electrostatic force, the chuck comprising:
   a dielectric member;
   a temperature conditioning fluid channel within the dielectric member;
   a drive electrode, within the dielectric member and between the temperature conditioning, fluid channel and the object, configured to electrostatically attract the object towards the drive electrode; and
   a first shield electrode configured to reduce or prevent generation of an electric field across a fluid in the temperature conditioning fluid channel when a voltage is applied to the drive electrode.

2. The chuck according to claim 1, wherein the first shield electrode is configured to separate a first region of the dielectric member having the drive electrode from a second region of the dielectric member having the temperature conditioning fluid channel, the first region being different from the second region.

3. The chuck according to claim 2, further comprising:
   a channel heater configured to apply a localized heating in the second region of the dielectric member having the temperature conditioning fluid channel.

4. The chuck according to claim 3, wherein the channel heater is configured to apply a varying localized heating in the second region of the dielectric member having the temperature conditioning fluid channel as a function of position along a length of the temperature conditioning fluid channel.

5. The chuck according to claim 1, wherein the first shield electrode is configured to coat an inner surface of the temperature conditioning fluid channel.

6. The chuck according to claim 1, further comprising:
   a first compensating electrode, within the dielectric member, configured to provide an electric current in the dielectric member to compensate for changes in dissipated power within the dielectric member with respect to changes in operation of the drive electrode.

7. The chuck according to claim 6, wherein the first compensating electrode is positioned between the drive electrode and the first shield electrode.

8. The chuck according to claim 6, wherein the first compensating electrode is positioned equidistant from the drive electrode and the first shield electrode.

9. The chuck according to claim 1, further comprising:
   a chuck clamping electrode, within the dielectric member and between the temperature conditioning fluid channel and the supporting table, configured to electrostatically attract the chuck to the supporting table.

10. The chuck according to claim 9, further comprising:
    a second shield electrode configured to reduce or prevent generation of an electric field across the fluid in the temperature conditioning fluid channel when a voltage is applied to the chuck clamping electrode.

11. The chuck according to claim 10, wherein at least a portion of the second shield electrode is positioned between the chuck clamping electrode and the temperature conditioning fluid channel.

12. The chuck according to claim 10, wherein the second shield electrode is configured to separate a third region of the dielectric member having the chuck clamping electrode from the second region of the dielectric member having the temperature conditioning fluid channel, the third region being different from the first and second regions.

13. The chuck according to claim 1, wherein a cross-section of the temperature conditioning fluid channel is enclosed by the dielectric member.

14. The chuck according to claim 1, wherein:
    the drive electrode is configured to operate at a first voltage that generates a first amount of dissipated power in a region between the drive electrode and the first shield electrode in response to the drive electrode being switched on;
    a first compensating electrode is configured to operate at a second voltage that generates a second amount of dissipated power in the region between the drive electrode and the first shield electrode in response to the drive electrode being switched off;
    the first and second amounts of dissipated power are substantially equal; and
    the first and second voltages are different from each other.

15. A lithography apparatus comprising:
    a chuck configured to hold a patterning device, the patterning, device being capable of imparting a radiation beam with a pattern in its cross-section to form a patterned radiation beam, the chuck comprising:
    a dielectric member,
    a temperature conditioning fluid channel within the dielectric member,
    a drive electrode, within the dielectric member and between the temperature conditioning fluid channel and the patterning device, configured to electrostatically attract the patterning device towards the drive electrode, and a first shield electrode configured to reduce or prevent generation of an electric field across a fluid in the temperature conditioning fluid channel when a voltage is applied to the drive electrode;

a substrate table configured to hold a substrate; and a projection system configured to project the patterned radiation beam onto a target portion of the substrate.

16. A lithography apparatus comprising:

a chuck configured to hold a substrate, the chuck comprising:

a dielectric member, a temperature conditioning fluid channel within the dielectric member, a drive electrode, within the dielectric member and between the temperature conditioning fluid channel and the substrate, configured to electrostatically attract the substrate towards the drive electrode, and a first shield electrode configured to reduce or prevent generation of an electric field across a fluid in the temperature conditioning fluid channel when a voltage is applied to the drive electrode;

a support configured to support a patterning device, the patterning device being capable of imparting a radiation beam with a pattern in its cross-section to form a patterned radiation beam; and a projection system configured to project the patterned radiation beam onto a target portion of the substrate.

17. A method of using a chuck that is configured to hold an object onto a supporting table of a lithography apparatus by electrostatic force, the method comprising:

applying a potential difference between a drive electrode of the chuck and the object to electrostatically attract the object towards the drive electrode, wherein the drive electrode is within a dielectric member of the chuck and between the object and a fluid channel of the chuck; and shielding, using a shield electrode, a first region of the dielectric member having the drive electrode from a second region of the dielectric member having the fluid channel to reduce or prevent generation of an electric field across a fluid in the fluid channel when a voltage is applied to the drive electrode.

18. The method according to claim 17, further comprising connecting the shield electrode to ground.

19. The method according to claim 17, further comprising:

providing an electric current, using a compensating electrode, to compensate for changes in dissipated power within the dielectric member with respect to changes in operation of the drive electrode.

20. The method according to claim 17, further comprising:

operating the drive electrode at a first voltage that generates a first amount of dissipated power in a region between the drive electrode and the first shield electrode in response to the drive electrode being switched on; and operating a first compensating electrode at a second voltage that generates a second amount of dissipated power in the region between the drive electrode and the first shield electrode in response to the drive electrode being switched off, wherein:

the first and second amounts of dissipated power are substantially equal; and the first and second voltages are different from each other.

* * * * *